(12) United States Patent
Collier

(10) Patent No.: US 6,646,332 B2
(45) Date of Patent: Nov. 11, 2003

(54) SEMICONDUCTOR PACKAGE DEVICE

(76) Inventor: Terence Quintin Collier, 1910 Sunset Hill, Rowlett, TX (US) 75088

( * ) Notice: Subject to any disclaimer, the term of this patent is extended or adjusted under 35 U.S.C. 154(b) by 0 days.

(21) Appl. No.: 10/213,760

(22) Filed: Aug. 7, 2002

(65) Prior Publication Data

US 2003/0137036 A1 Jul. 24, 2003

Related U.S. Application Data

(60) Provisional application No. 60/349,489, filed on Jan. 18, 2002.

(51) Int. Cl.[7] .............................................. H01L 23/02
(52) U.S. Cl. ..................... 257/678; 257/678; 257/686
(58) Field of Search ................. 257/678, 706, 257/780, 686; 438/612, 118; 228/180.2; 437/195; 361/720

(56) References Cited

U.S. PATENT DOCUMENTS

| | | | | |
|---|---|---|---|---|
| 5,275,330 A | * | 1/1994 | Isaacs et al. | 228/180.2 |
| 5,599,744 A | * | 2/1997 | Koh et al. | 437/195 |
| 5,700,735 A | * | 12/1997 | Shiue et al. | 438/612 |
| 5,774,336 A | * | 6/1998 | Larson | 361/720 |
| 5,786,238 A | * | 7/1998 | Pai et al. | 438/118 |
| 6,028,367 A | * | 2/2000 | Yu | 257/780 |
| 6,204,559 B1 | * | 3/2001 | Lin et al. | 257/738 |
| 2002/0149102 A1 | * | 10/2002 | Hashemi et al. | 257/706 |

* cited by examiner

*Primary Examiner*—David Nelms
*Assistant Examiner*—Thinh T. Nguyen
(74) *Attorney, Agent, or Firm*—Michael Diaz

(57) ABSTRACT

Disclosed are semiconductor packages and methods incorporating the use of vias in layers of leaded and nonleaded multilayer packages. The vias provide fluid communication between layers such that bonding material flows among layers for the formation of a 3D bond. As disclosed, the layers may comprise leads, dice, bond pads, or other substantially planar semiconductor package surfaces.

18 Claims, 1 Drawing Sheet

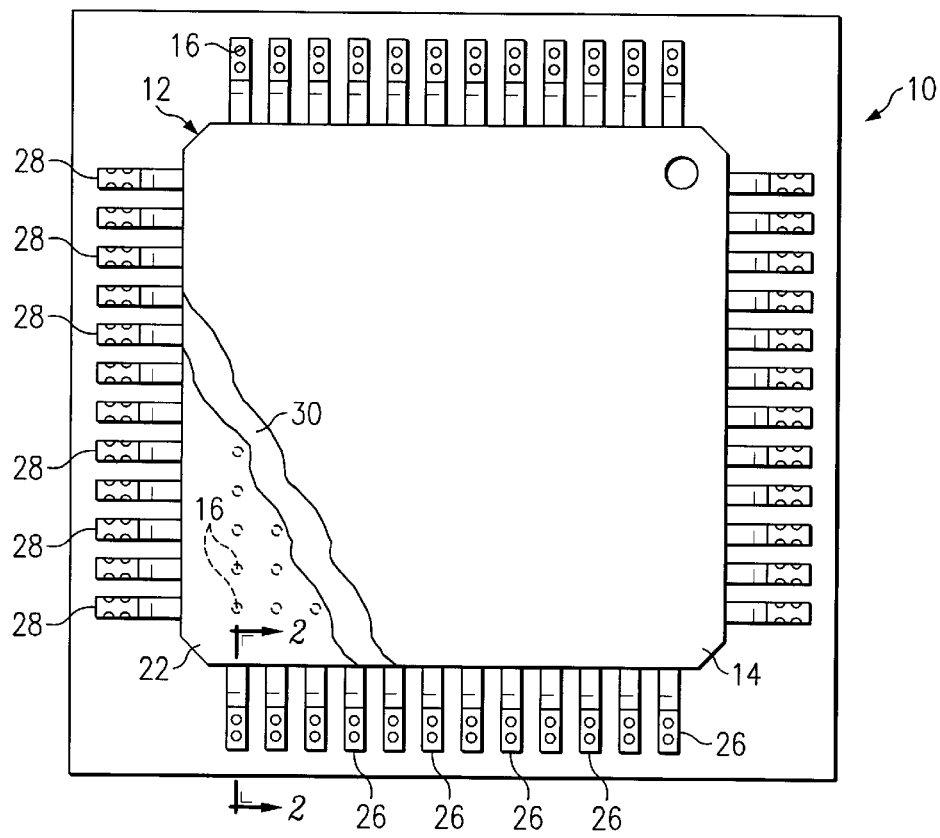
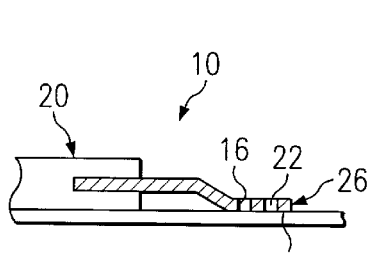
FIG. 2
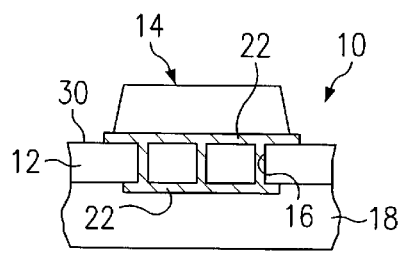
FIG. 3A
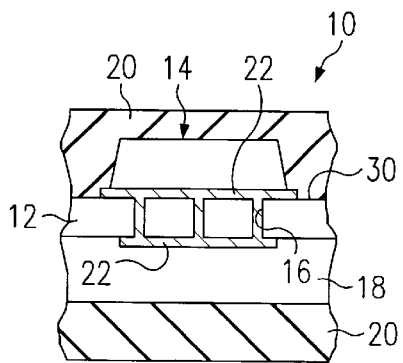
FIG. 3B
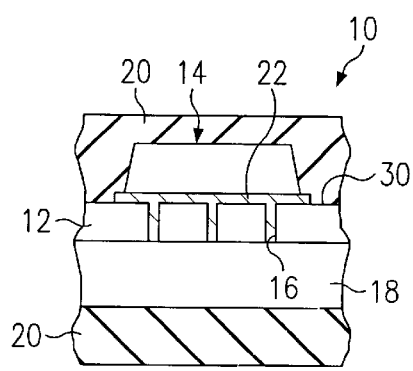
FIG. 4

SEMICONDUCTOR PACKAGE DEVICE

PRIORITY DATE

This application claims the benefit of U.S. Provisional Application No. 60/349,489, which has been granted a filing date of Jan. 18, 2002.

TECHNICAL FIELD

The invention relates to devices and methods for packaging integrated circuit (IC) devices. More particularly, the invention relates to devices and methods using vias among adjoining layers of semiconductor packages for improved bonding and reduced mechanical stress.

BACKGROUND OF THE INVENTION

In use, integrated circuits (ICs) generally require electrical connections to a substrate to form a package providing electrical connections to additional electronic devices. In general a package substrate may include, but not be limited to, multiple layers of semiconductor, mask, conductive and non-conductive materials, dielectrics, encapsulates, thermal management items, etc., depending upon the complexity of the electrical connections to be made. In practice, the more layers, the higher the manufacturing effort and expense. Frequently an IC die is included on a package substrate along with other ICs or one or more discrete passive components such as resistors, capacitors, and so forth.

A die is typically attached to a "bond pad" using an adhesive such as epoxy, solder, or some form of eutectic metal that attaches the die without introducing damaging temperature, stress, or contamination into the semiconductor die. This "die attach material" can be purely mechanical or chemical bonding or a combination of chemical/mechanical bonds to form electrical and/or thermal paths, or neither, serving only as a substrate. With any combination thereof, the ability of the attach material to maintain a bond is critical in most applications. Failure of the die attach bond, or other bonded interface, can result in package failure resulting in overall electrical failure in the final system.

A common method to "bond" a semiconductor to a PC board is with a "leaded" package. The package leads are typically bonded with a combination of metals that reflow (melt) typically around 160 to 260 degrees Celsius, achieving a mechanical, chemical or chemical/mechanical bond between the lead and the PC board. Epoxy pastes are also used to form bonds. Such bonds may serve as the electrical contact between the device and the board and may also serve as a thermal path or as neither, merely affixing the components together.

Failure in the die attach, or various layers, usually shows as a "delamination," or separation, at one or more of the interfaces. This failure may occur in the bulk of the die attach material, at the die attach to die, or die attach to bond pad interface or one of the many other layers. This separation is visually observed as a "crack" in the one or more of the layers. Likewise, failure at the lead to bond pad may show similar failure mechanisms.

Packaging methods and devices providing for strong and durable bonds resistant to mechanical failure/fatigue would be useful and desirable in the arts. Increases in bonding strength for packaged devices would also lead to flexibility in terms of improvements in package size and concurrent design limitations.

SUMMARY OF THE INVENTION

In general, devices and methods providing improved semiconductor package performance resistant to mechanical stresses are disclosed.

According to one aspect of the invention, a multi-layer laminated semiconductor package includes first and second layers, at least one of which is perforated by vias. The layers adjoin one another along approximately planar surfaces with the vias providing additional bonding structure. An attach material is provided between the attaching surfaces of the layers and within the vias, ensuring a secure bond.

According to another aspect of the invention, one of the layers is a semiconductor die.

According to another aspect of the invention, one of the layers is a semiconductor die lead foot.

According to other aspects of the invention, one of the layers is a bond pad, substrate or tape. Various bond surfaces may be used depending on package type.

According to still another aspect of the invention, the vias include an expanded end portion at a layer surface opposing the attach surface for accepting attach material.

According to an additional aspect of the invention, the vias are arranged at predetermined intervals.

According to yet another aspect of the invention, the vias are arranged at predetermined predicted stress points.

According to another aspect of the invention, a method is provided for bonding the layers of a multi-layer laminated semiconductor package. Steps in the method include perforating one or more layers with one or more vias. In a further step, attach material is introduced into the vias and between the layers such that the layers are securely bonded.

According to still another aspect of the invention, the perforating vias are formed by drilling.

According to yet another aspect of the invention, a step of predicting potential stress points is used for determining the arrangement of vias.

Technical advantages provided by the invention include, but are not limited to, stronger and improved failure-resistant bonds resulting in increased reliability, performance, and a potential reduction in the amount of attach material necessary for bonding. Further advantages are realized in the potential for making smaller packages due to flexibility for changes in lead and package geometry. For example, potential limiting factors in lead design, such as the minimum requirements for adequate solder coverage become less limiting with the use of the invention. Improvements in the reflow profiles in solder bonds may also be achieved.

BRIEF DESCRIPTION OF THE DRAWINGS

For a better understanding of the invention including its features, advantages and specific embodiments, reference is made to the following detailed description along with accompanying drawings in which:

FIG. 1 depicts a top view of a package showing an example of a preferred embodiment of the invention; and FIG. 2 shows a cross-section view of a portion of FIG. 1 taken along line 2—2 of FIG. 1;

FIG. 3A illustrates a cross-section view of an alternative example of an embodiment of the invention prior to the addition of an encapsulant;

FIG. 3B shows a cross-section view of the embodiment of FIG. 3A with encapsulant added; and FIG. 4 illustrates a cross-section view of an additional example of an alternative embodiment of the invention.

References in the detailed description correspond to like references in the figures unless otherwise noted. Like numerals refer to like parts throughout the various figures. The descriptive and directional terms used in the written description such as top, bottom, left, right, first, second, etc., refer to the drawings themselves as laid out on the paper and not to physical limitations of the invention unless specifically noted. The drawings are not to scale and some features of embodiments shown and discussed are simplified or exaggerated for illustrating the principles of the invention.

DETAILED DESCRIPTION OF PREFERRED EMBODIMENTS

While the making and using of various embodiments of the present invention are discussed in detail below, it should be appreciated that the present invention provides many applicable inventive concepts, which can be embodied in a wide variety of specific contexts. It should be understood that the invention may be practiced with substrate bond pads and semiconductor dice of various types and materials without altering the principles of the invention.

Referring primarily to FIG. 1, a preferred embodiment of the invention is shown. A multi-layer semiconductor package 10 is made up of a first layer 14 and a second layer 12 of semiconductor material. Those skilled in the art will realize that an "encapsulating" material (not shown) has been removed in FIG. 1 to view the internal layers of the package. Those skilled in the art will appreciate that a semiconductor device may be mounted on a substrate having many layers and that the principles of the invention are not limited to the two layers shown. For example, a layer may comprise a die, lead foot, or bond pad. For the purposes of this example, one of the layers 14 is an IC die. At least one layer, in this case the second layer 12, is provided with vias 16. The vias 16 extend through the second layer 12, completely perforating it from one planar surface to the opposite surface. The vias 16 may be formed by drilling (laser, mechanical, etc.), etch (chemical, dry, plasma, etc.), or other methods known to those skilled in the arts. Preferably, the vias 16 extend approximately perpendicularly through the second layer 12.

The design is not limited to any specific geometrical shape for the vias 16 though a circular via is shown in FIG. 1. No limitations or restrictions to dimensions, aspect ratio, or placement(s) of vias is implied. The circle is used in this preferred embodiment as, in general, the circle or oval will have a cleaner fill. Those skilled in the art are aware that sharp angles, such as the corners of a square, triangle or any other n-sided polyhedra, can produce sites where poor coverage promotes voiding, introduce sites that promote trapping of plating solutions, and provide areas with higher probabilities of contamination. Sharp angles may also be sites for increased stress loci. It should be understood that the vias 16 may be provided within package 10, bond pads 24, lead foot areas 26, or other substantially planar surfaces wherein a bond is desired. As shown in lead foot 28 of FIG. 1, the vias 16 may alternatively be offset to engage the edge of the planar surface, in this case the edges of lead foot 28.

FIG. 1 depicts examples of vias 16 in two locations, the lead foot 26, 28, and the IC substrate 12 where the Integrated Circuit package 10 is attached to a bond pad 24. The invention is not limited to these package types or location. Ball Grid Array (BGA) packages have a "base" to attach the die similar to the structures, e.g. bond pads, in leaded packages. As packages grow more complex incorporating dual die packages, chip scale packaging, BGA's etc., vias may be placed in a number of locations to promote strength, durability and added resistance to mechanical failure.

In addition to improving the bond integrity, the vias 16 may also serve to improve the electrical and thermal aspects of the bond depending on the attach material, since the via will be in direct contact with the die or lead foot. Since many materials have "better" properties in "preferred" directions, introducing vias may help improve electrical and mechanical properties along the preferred directions. Depending on the attach material, intermetallics can also form at the various interfaces and within the bulk of the die attach. The intermetallics, in some cases, may have inferior electrical and thermal conductivity than the individual constituent. Vias could provide a path that circumvents the "bad" IMC's but may or may not provide additional benefits in each layer.

Due to the geometries of the bond pad and leadframe, solder paste application and properties, bonding will typically occur in a lateral direction to the PC board (some perpendicular bonding will occur on the sides, front and back of the lead foot as the solder "wicks up the sides"). The area of a traditional leadframe that bonds to the board is defined as the lead foot. Conceptually, if one thinks of the letter "L" as the part of a leadframe extending from an Integrated Circuits package, the bottom part of the "L" is the area that is bonded to the PC board. That bottom portion of the "L" is referred to herein as the lead foot. Different package types may have one or more areas that serve a similar role as the "foot" in a traditional leaded package.

FIG. 2 shows a cross section taken along line 2—2 of FIG. 1. The vias 16 thus may provide additional 3D contact surfaces to promote stronger bonding in the direction generally perpendicular to the standard bond interface. Attach material 22 known in the art for attaching the leadfoot 26 to a surface such as a bond pad 24 is used. Vias may also be used for layer alignment based on the design. For example, vias in two or more layers may be provided for use in guiding the alignment of adjoining layers. Those skilled in the arts will recognize that many techniques may be used to induce bonds to form in the vias. For example, a full or partial vacuum may be used to flow attach material, or solder/adhesive may be placed in the vias or on the substrate prior to assembly or reflow. As another alternative, solder plugs similar to BGA balls could be added to the vias.

Referring primarily to FIGS. 3A–4, in assembling the multi-layer semiconductor package 10, the first layer 14 and second layer 12 are positioned such that their substantially planar surfaces adjoin for attaching. Preferably, attach material 22 is flowed onto the adjoining attaching surfaces of layers 12 and 14 and into the vias 16. Thus, when the attach material 22 cures, a "3D bond" between the layers is achieved. It should be understood that the 3D bond is formed due to the provision of vias 16 in one or more layers of the package 10. The addition of a third dimension and increase in the bonding interface provide a number of advantages further described below. It should be understood that vias may alternatively be provided in two or more adjoining layers. In such cases, the locations of the vias, may be staggered or aligned, or a combination of aligned and staggered vias may be used.

Mechanically, one method to prevent a crack from propagating is to insert a stress reliever in the path of a crack. A stress reliever can be a geometrical feature, for example a hole, placed in the path of the crack. This stress reliever has the ability to absorb or redirect energy a crack needs to grow, preventing the crack from propagating. A via forms this hole, and in some cases, not only terminates a crack but can prevent the crack from initiating. A via can also form an escape path for moisture, stored VOC's, and provide relief for other stress inducers.

Overall bond strength will be directly proportional to the total surface area participating in the bond. By adding vias to the leadframe, additional surface area is created that may also contribute to bonding. Through either capillary forces, surface tension, other chemical-mechanical means, or combinations thereof, the vias can "wick" attach material into the cavity and, in some cases, through the leadframe.

FIG. 3A is a cross-section view of an alternative embodiment of the invention wherein a substrate layer 12 is provided with vias and an attached layer 14 is an IC die. As will be apparent to those skilled in the arts, the attach material 22 may be flowed into the vias 16 and between the layers 12, 14 in order to form a 3D mechanical bond adhering the die 14 to the substrate 12. Additional layers 18 may also be attached, either with or without vias, depending on the requirements of the specific application. An encapsulant 20 typically engulfs the finished package 10 as shown in FIG. 3B. Note that as shown in FIGS. 3A and 3B, a recessed area of additional layer 18 may be provided in order to permit the entry of attach material 22 in order to create a more secure bond. This recessed area acts as an extension of the vias and may be provided in the layer having vias, in this example the substrate layer 12, the adjoining layer 18, as shown, or in both locations.

In a further example of an alternative implementation of the invention, temporary layers may be used for controlling the placement of attach material at an interface. Referring to FIG. 3A, layer 18 may be temporarily placed as shown to ensure correct placement of attach material 22, and then removed after the attach material 22 has been placed, leaving a secure bond.

FIG. 4 shows an alternative implementation of a package 10 with vias 16 in a substrate layer 12. The attach material 22 bonds an IC die 14 to the substrate layer 12 creating a bond that includes an interface between the layer 12, 14, surfaces, as well as the vias 16.

Typically vias are placed at an angle substantially perpendicular to the plane of the layers, however, other angles may be used. Solder joint failures typically run parallel to the bond interface (lateral to the PC board). By placing a bonded surface at almost perpendicular to the direction of the crack growth, further growth can be reduced if not impeded and terminated completely. Thus, by the addition of vias, a built-in-mechanism to impede crack growth and additional bonding area perpendicular to the lateral bond surfaces are provided. The solder/epoxy may wick into the via either due to capillary action, surface tension, chemical-mechanical forces such as the application of a full or partial vacuum, or any combination thereof, providing additional bonding surface between layers of the package. The additional bonding interfaces also provide more area for electrical contact pre and post any problem with the bond. Temperature profiles (time and peak temperature) may be reduced as well since less leadframe base metal (reduction in overall leadframe mass due to missing material in the vias) will be present to consume heat from the reflow or curing operation.

General practice is to hold the peak temperature during reflow (solder) around −30° C. above liquidus temperature for some time X that is determined based on a number of factors such as board density, board size, atmosphere, package types populating the board, etc., to achieve reliable solder joints.

A typical reflow cycle exposes the board and the components to a pre-heat prior to the actual reflow portion of the cycle. A number of factors contribute to the actual peak temperature of liquids during the reflow cycle. Since the primary goal is to reflow the solder to form a strong mechanical, chemical, and/or chemical-mechanical bond between the solder and lead, the less heat required into the system to achieve this bond will save process cycle time and cost. A leadframe consumes some heat prior to reflow. This heat consumption depends on the mass of the leadframe, any conduction to attached surfaces or structures such as the package body mold compound, die, die attach, die pad, etc., and the starting temperature of the leadframe. Reducing the mass of the leadframe helps to reduce the time and temperature necessary to achieve the reliable bond and allows one to optimize the overall process cycle time and temperature input variable.

By introducing vias into the leadframe, a fixed mass of material is removed from the leadframe. The net result may be less heat required to bring the leadframe to reflow temperatures. Higher temperature's may also be unnecessary, as stated previously, due to improved bonding as the molten solder fills the vias to form additional bond sites. The vias also provide additional bond strength. Reductions in fillet area may also permit higher lead densities.

Any number of factors control the maximum semiconductor devices that can be placed on a PC board (PCB). Shorts between package leads cause a number of failures in PCBs. Wicking, one culprit, has a root cause that can be attributed to lead profiles, (the geometrical shape of the lead, length, aspect ratio, or the spacing between centerlines of adjacent leads). Lead geometries and "un-optimized" processes can impose restrictions on the minimum size of current packages.

Vias have the potential to reduce wicking, allowing an optimization of the spacing between leads can be optimized. This optimization allows closer spacing of leads and may provide a potential to reduce overall package dimensions and geometries. This reduction in Integrated Circuits package geometry also allows the PCB to become smaller. Thus, the invention provides advantages in stronger and improved failure-resistant bonds resulting in increased reliability, performance, and a potential reduction in the amount of attach material needed for bonding and a reduction in lead and package size.

The embodiments shown and described above are only exemplary. Additional applications for the invention may be made, for example, components such as chip capacitors and resistors could benefit from this invention by modifying the terminations. Changes to the current end terminations could be improved by incorporating features that allow vias to be used. These vias could have similar benefits as failures in these components can occur due to similar items such as stressed solder joints and incomplete electrical contacts. Minimum fillet size requirements could also be improved with the addition of vias. In all cases, the via could be pre or partially filled prior to mounting.

Even though numerous characteristics and advantages of the present invention have been set forth in the foregoing description together with details of the method and device of the invention, the disclosure is illustrative only and changes may be made within the principles of the invention to the full extent indicated by the broad general meaning of the terms used in the attached claims.

I claim:

1. A multi-layer laminated semiconductor package comprising:
   a first layer;
   a second layer adjoining the first layer, the second layer having a plurality of perforating vias; and
   an attach material disposed in the vias and between the adjoining first and second layers for bonding the first and second layers of the laminated semiconductor package.

2. The multi-layer laminated semiconductor package of claim 1 wherein at least one of the layers further comprises a semiconductor die.

3. The multi-layer laminated semiconductor package of claim 1 wherein at least one of the layers further comprises a bond pad.

4. The multi-layer laminated semiconductor package of claim 1 wherein at least one of the layers further comprises a semiconductor lead foot.

5. The multi-layer laminated semiconductor package of claim 1 wherein one or more of the layers further comprises one or more of recessed portions aligned with a plurality of vias and having attach material disposed therein.

6. The multi-layer laminated semiconductor package of claim 1 wherein the attach material comprises solder.

7. The multi-layer laminated semiconductor package of claim 1 wherein the attach material comprises epoxy.

8. The multi-layer laminated semiconductor package of claim 1 wherein the vias are substantially perpendicular to the attachment surfaces.

9. The multi-layer laminated semiconductor package of claim 1 wherein the vias are arranged with predetermined intervals therebetween.

10. The multi-layer laminated semiconductor package of claim 1 further comprising one or more additional adjoining layers to form a multi-layer semiconductor package having more than two layers.

11. A multi-layer laminated semiconductor package comprising:

a first perforated layer having a plurality of vias and a surface;

a second layer aligned with the first layer, the surface of the first layer adjoining and being coplanar with a surface of the second layer; and an attach material located between adjoining coplanar surfaces of the first and second layer and within the plurality of vias such that a bond is formed between the layers wherein the vias provide an additional bonding surface.

12. The multi-layer laminated semiconductor package of claim 11 further comprising:

at least one additional perforated layer coplanarly aligned with the first or second layer; and a second attach material between adjoining coplanar surfaces of the aligned first or second layers and the additional layer such that a bond is formed between the layers to form a multi-layer laminated semiconductor package comprising three or more layers.

13. The multi-layer laminated semiconductor package of claim 11 further comprising at least one additional perforated layer having a second plurality of vias.

14. The multi-layer laminated semiconductor package of claim 11 wherein the first layer includes perforations substantially perpendicular to the first layer.

15. The multi-layer laminated semiconductor package of claim 11 wherein the attach material is solder.

16. The multi-layer laminated semiconductor package of claim 11 wherein the attach material is epoxy.

17. The multi-layer laminated semiconductor package of claim 11 wherein the attach material is flowed by a vacuum.

18. The multi-layer laminated semiconductor package of claim 11 wherein the first layer is perforated by a laser drill.

* * * * *